US010917105B1

(12) United States Patent
Ayman et al.

(10) Patent No.: US 10,917,105 B1
(45) Date of Patent: Feb. 9, 2021

(54) SUCCESSIVE APPROXIMATION ANALOG-TO-DIGITAL CONVERTER WITH NONLINEARITY COMPENSATION

(71) Applicant: Shenzhen Goodix Technology Co., Ltd., Shenzhen (CN)

(72) Inventors: Ismail Ayman, Cairo (EG); George Botros, Cairo (EG); Elsayed Ayman, Fountain Valley, CA (US)

(73) Assignee: SHENZHEN GOODIX TECHOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/115,754

(22) Filed: Aug. 29, 2018

(51) Int. Cl.
| | | |
|---|---|---|
| *H03M 1/06* | (2006.01) | |
| *H03M 1/46* | (2006.01) | |
| *H03L 7/081* | (2006.01) | |
| *H03M 1/12* | (2006.01) | |

(52) U.S. Cl.
CPC .......... *H03M 1/462* (2013.01); *H03L 7/0812* (2013.01); *H03M 1/125* (2013.01); *H03M 1/466* (2013.01)

(58) Field of Classification Search
CPC .... H03M 1/468; H03M 1/1245; H03M 1/462; H03M 1/466; H03M 1/38; H03M 1/804; H03M 1/46; H03M 1/002; H03M 1/08; H03M 1/1009; H03M 1/12
USPC ......................... 341/118, 129, 155, 172, 120
See application file for complete search history.

(56) References Cited

U.S. PATENT DOCUMENTS

| | | | | |
|---|---|---|---|---|
| 7,834,796 | B2 * | 11/2010 | Xu ........................ | H03M 1/466 341/172 |
| 9,019,140 | B2 * | 4/2015 | Zhao ................... | H03M 1/0604 341/161 |
| 2011/0205099 | A1 * | 8/2011 | Inoue ...................... | H03K 5/24 341/158 |
| 2012/0280846 | A1 * | 11/2012 | Lin ....................... | H03M 1/002 341/172 |
| 2015/0194981 | A1 * | 7/2015 | Tang .................... | H03M 1/442 341/172 |
| 2016/0191072 | A1 * | 6/2016 | Rath .................... | H03M 1/468 341/122 |
| 2016/0233872 | A1 * | 8/2016 | Wei ........................ | H03M 3/37 |
| 2018/0219559 | A1 * | 8/2018 | Lee ...................... | H03M 3/434 |

* cited by examiner

*Primary Examiner* — Linh V Nguyen
(74) *Attorney, Agent, or Firm* — Kilpatrick Townsend & Stockton LLP

(57) ABSTRACT

Successive-approximation-register (SAR) analog-to-digital conversion technique continues to be one of the most popular analog-to-digital conversion techniques, due to their versatility, which allows providing high resolution output or high conversion rates. In addition, SAR analog-to-digital converters (ADC) have a modest circuit complexity that results in low-power dissipation. A SAR ADC is, typically, composed of a single comparator, a bank of capacitors and switches, in addition to, a control digital logic. However, the comparator input capacitance is input-signal dependent, and hence introduces non-linearity to the transfer characteristics of the ADC. A simple technique is devised to significantly reduce this non-linearity, by pre-distorting the sampled-and-held input signal using the same comparator input capacitance.

6 Claims, 10 Drawing Sheets

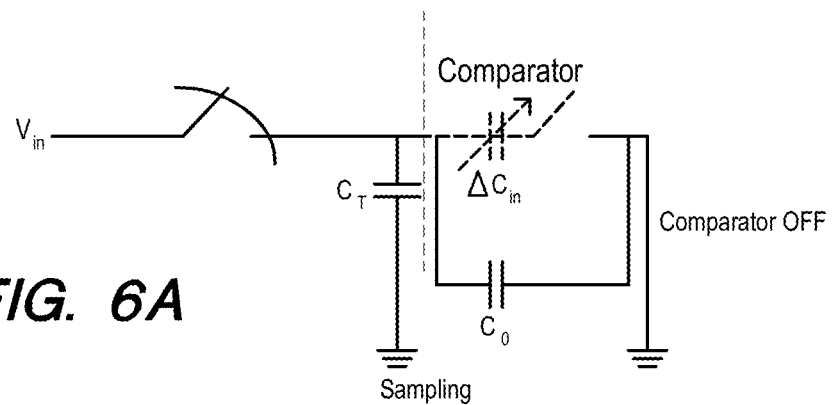
FIG. 6A Sampling
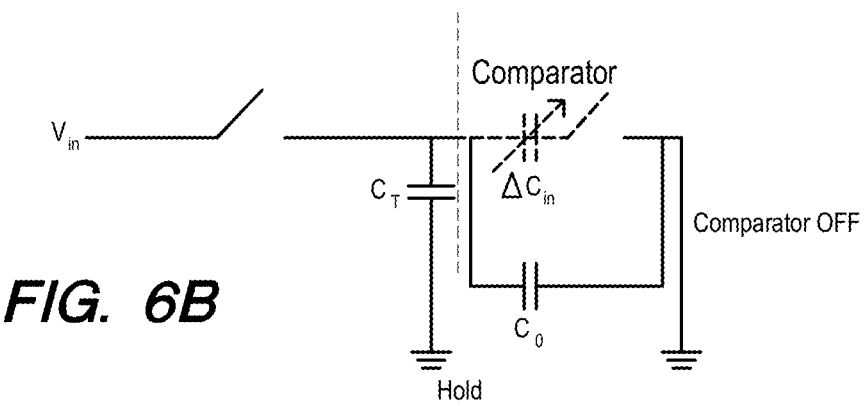
FIG. 6B Hold
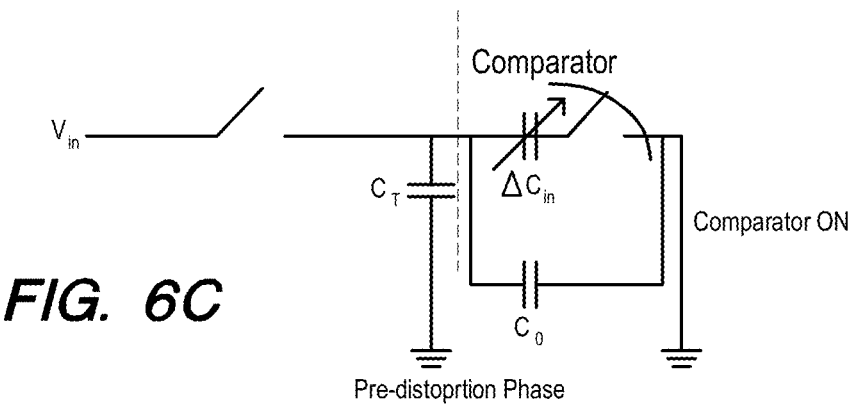
FIG. 6C Pre-distoprtion Phase
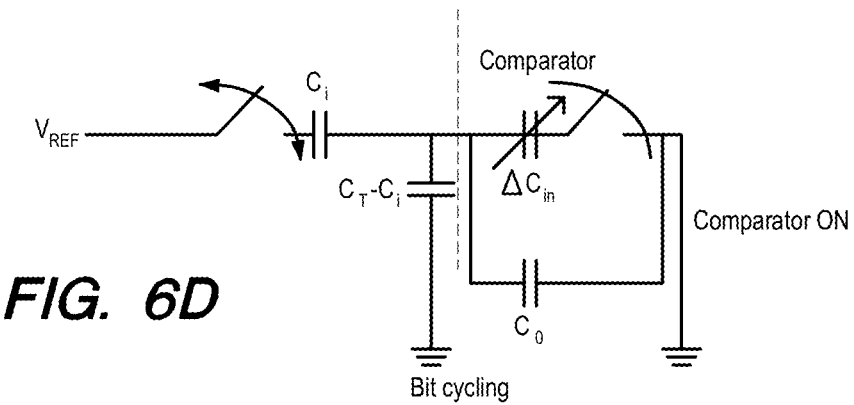
FIG. 6D Bit cycling

SUCCESSIVE APPROXIMATION ANALOG-TO-DIGITAL CONVERTER WITH NONLINEARITY COMPENSATION

BACKGROUND

SAR analog-to-digital conversion technique is based on the binary search algorithm, in which the input voltage signal is compared successively to a number of values. In a conventional SAR technique, each of these values divides the search space in two. For an N number of bits of resolution, the binary search needs N steps.

SAR analog-to-digital converters are realized, mainly, using a sample-and-hold (S/H) stage, a comparator, and a digital-to-analog converter (DAC). These blocks are controlled by control logic, including a successive-approximation register (SAR). The operation of the SAR ADC starts by sampling the input analog signal, through the S/H stage. Then, the held signal is compared to the DAC output voltages, over a number of comparison cycles equal to the target resolution N. This process is called bit-cycling. Thus the SAR ADC operation is composed of a sample-and-hold phase, followed by a bit-cycling phase. In the first comparison cycle the held input signal is compared to half of the ADC full-scale range, generated by the DAC. The result of the comparison determines the most-significant-bit (MSB) of the digital output, and determines the next value to be compared to the input signal. If the input signal is greater than the DAC output, the MSB is set to logic "1", and the input signal is compared to a higher value (three-quarters of the full-scale), in the next comparison cycle. Otherwise, the MSB is set to logic "0" and the input signal is compared to one-quarter of the ADC full-scale range. The control logic sets the DAC digital input to generate the next value, which gets compared to the input signal, to determine the bit following the MSB. The conversion cycles continues resolving all the following bits, in a similar fashion, down to the least-significant-bit (LSB).

The most common and widely used implementation of the SAR ADC employs a binary-weighted capacitive DAC, such that the sampled input is stored on the DAC capacitors. However, for high resolution SAR ADCs (mainly greater than 10-bits), the ratio of the biggest capacitor to the smallest capacitor can be too big for practical realization (>1000). That is either the smallest capacitor would be comparable to parasitics, increasing the ADC sensitivity to parasitics or if the smallest capacitor is made considerably larger than parasitics, the largest capacitor would be too large, much more than the value dictated by matching, consuming both Si-area and power. Therefore, for high-resolution SAR ADC, the SAR DAC is, typically, implemented as a hyprid DAC, with a capacitive main DAC (MDAC) to resolve the MSB's and a resistive sub-DAC (SDAC) to resolve the LSB's [1].

Typically, the SAR ADC is used to achieve high accuracy analog-to-digital conversion up to 16-bits, if calibration is used to correct for the DAC capacitors mismatch [1]. Recently, SAR ADC was used, also, for low and medium-resolution conversion [2], making SAR ADC the architecture of choice to many applications spanning the full accuracy range, from low to high accuracy range.

In high-accuracy SAR ADCs, the sample-and-hold circuit of the SAR ADC employs bootstrapping, so as not to limit performance [3-4], and the SAR ADC accuracy and linearity are mainly defined by the non-idealities of the DAC and the comparator parasitic input capacitance, arising from the comparator input transistors [3-4].

More specifically, the mismatch of the DAC elements (capacitors or resistors) can introduce integral non-linearity (INL) and differential-non-linearity (DNL) that degrade the ADC accuracy and linearity. There are two main approaches to avoid performance degradation due to DAC elements mismatch, depending on the ADC target resolution. For medium resolution SAR (~10 bits), the physical area of the elements are increased to improve the matching of the elements, since the standard deviation of the element value is inversely proportional to the square root of its area. Thus, the larger the area of the element, the lower the deviation in its value. However, the increased area, results in increased cost for the ADC and higher power dissipation. For higher resolution ADCs, this approach becomes impractical and would result in unacceptably large-area elements. Hence, calibration of the DAC mismatch is adopted for high resolution ADCs, allowing using smaller DAC capacitances than that dictated by matching. The calibration circuitry may include additional analog circuitry, in addition to a digital calibration engine [1], or may only include digital post processing as reported recently in [5], achieving 1.4-bit improvement for a 12-bit SAR ADC.

It is important to note that the DAC elements mismatches are due to fabrication imperfection. Therefore, once the ADC is fabricated, these mismatch errors are fixed. Therefore, a calibration cycle can be conducted at ADC power ON, measuring these errors and storing the errors values, for later compensation during normal operation.

On the other hand, the comparator input parasitic capacitance nonlinearity stems from the capacitance variation with the input signal. Hence, it does not represent a fixed error that can be readily eliminated by calibration. The comparator input parasitic capacitance can cause considerable nonlinearity to the ADC, in a way that can limit the performance. The absolute amount of the non-linearity depends on the ratio of the DAC linear capacitance to the comparator non-linear capacitance. Since, the parasitic capacitance roughly scale with the same factor as the DAC capacitance, for higher resolution ADC, the degradation in linearity is more pronounced [3]. Also, using calibration to correct for DAC mismatch, and hence reducing the needed DAC capacitance, makes the non-linear comparator capacitance, even bigger compared to the DAC capacitance, and hence the problem of the non-linearity introduced by the comparator becomes more significant.

The first published SAR ADCs avoided comparator non-linearity, by using a complex switching scheme [6]. However, such switching scheme would require more energy for conversion as highlighted in [3], and does not lead to efficient power dissipation like modern switching schemes [3-4] [7]. It is worth noting that modern switching schemes not only result in lower power dissipation, but also significant reduction in SAR ADC area, due to the elimination of the MSB capacitor of the DAC [3-4] [7].

While the effect of the parasitic non-linear capacitance was under estimated in [3], causing serious degradation in performance, as admitted by the authors, a circuit topology to cancel the comparator non-linearity was, recently, reported in [4]. In [4] it is proposed to use a push-pull input stage, for the comparator. That is the input stage is proposed to have both an NMOS and PMOS transistors, such that the increase in the NMOS transistor input capacitance is, partially, compensated by the decrease in the PMOS input capacitance, so effectively the variation of the total input capacitance with the input voltage is reduced. Accordingly, the input capacitance variation of the comparator is reduced from 45 fF to 11 fF, in [4]. However, it is, well, understood that such a solution is impractical for industry, because of process corners variations, where PMOS and NMOS transistor characteristics can change after fabrication, in different directions. As a result, either the NMOS variation with input signal would exceed that of the PMOS, or vice versa. Therefore, in practical industry designs, NMOS and PMOS are seldom used to match or compensate each other. Also, the solution of [4] limits the topology of the comparator that can be used for SAR ADCs.

REFERENCES

[1] H. Lee, D. Hodges, and P. Gray, "A Self-Calibrating 15-bit CMOS A/D Converter," IEEE J. Solid-State Circuits, sc-19, no. 6, pp. 813-819, December 1984.
[2] Z. Cao, S. Yan, and Y. Li, "A 32 mW 1.25 GS/s 6b 2b/Step SAR ADC in 0.13 um CMOS," IEEE J. Solid-State Circuits, vol. 44, no. 3, pp. 862-873, March 2009.
[3] M. van Elzakker, E. van Tuijl, P. Geraedts, D. Schinkel, E. A. M. Klumperink, and B. Nauta, "A 10-bit Charge-Redistribution ADC Consuming 1.9 µW at 1 MS/s," *IEEE J. Solid-State Circuits*, vol. 45, no. 5, pp. 1007-1015, May 2010.
[4] S. Liu, Y. Shen, and Z. Zhu, "A 12-Bit 10 MS/s SAR ADC with High Linearity and Energy-Efficient Switching," *IEEE Trans. Circuits Syst-I: Reg. papers*, vol. 63, no. 10, October 2016.
[5] Y. Juan, H. Huang, S. Lai, W. Juang, S. Lee, and C. Luo, "A Distortion Cancelation Technique with the Recursive DFT Method for Successive Approximation Analog-to-Digital Converters," *IEEE Trans. Circuits Syst-I*: Express Briefs, vol. 63, no. 10, February 2016.
[6] J. McCreary and P. Gray, "All-MOS charge redistribution analog-to digital conversion techniques," IEEE J. Solid-State Circuits, vol. 10, no. 6, pp. 371-379, December 1975.
[7] C. Liu, S. Chang, G. Huang, and Y. Lin, "A 10-bit 50-Ms/s SAR ADC with a Monotonic Capacitor Switching Procedure," *IEEE J. Solid-State Circuits*, vol. 45, no. 4, pp. 731-740, April 2010.

BRIEF DESCRIPTION OF THE DRAWING FIGURES

The invention may be further understood from the following detailed description in conjunction with the appended drawing figures. In the drawing:

FIG. 6A is a diagram of a single ended version of the MDAC, in the sampling phase of operation in accordance with the predistortion technique of FIG. 5.

FIG. 6B is a diagram of a single ended version of the MDAC, in the hold phase of operation in accordance with the predistortion technique of FIG. 5.

FIG. 6C is a diagram of a single ended version of the MDAC, in the pre-distortion phase of operation in accordance with the predistortion technique of FIG. 5.

FIG. 6D is a diagram of a single ended version of the MDAC, in the bit-cycling phase of operation in accordance with the predistortion technique of FIG. 5.

DETAILED DESCRIPTION

Summary

Successive-approximation-register (SAR) analog-to-digital conversion technique continues to be one of the most popular analog-to-digital conversion techniques, due to their versatility, which allows providing high resolution output or high conversion rates. In addition, SAR analog-to-digital converters (ADC) have a modest circuit complexity that results in low-power dissipation. A SAR ADC is, typically, composed of a single comparator, a bank of capacitors and switches, in addition to, a control digital logic. However, the comparator input capacitance is input-signal dependent, and hence introduces non-linearity to the transfer characteristics of the ADC. A simple technique is devised to significantly reduce this non-linearity, by pre-distorting the sampled-and-held input signal using the same comparator input capacitance.

DESCRIPTION

Figure 1:
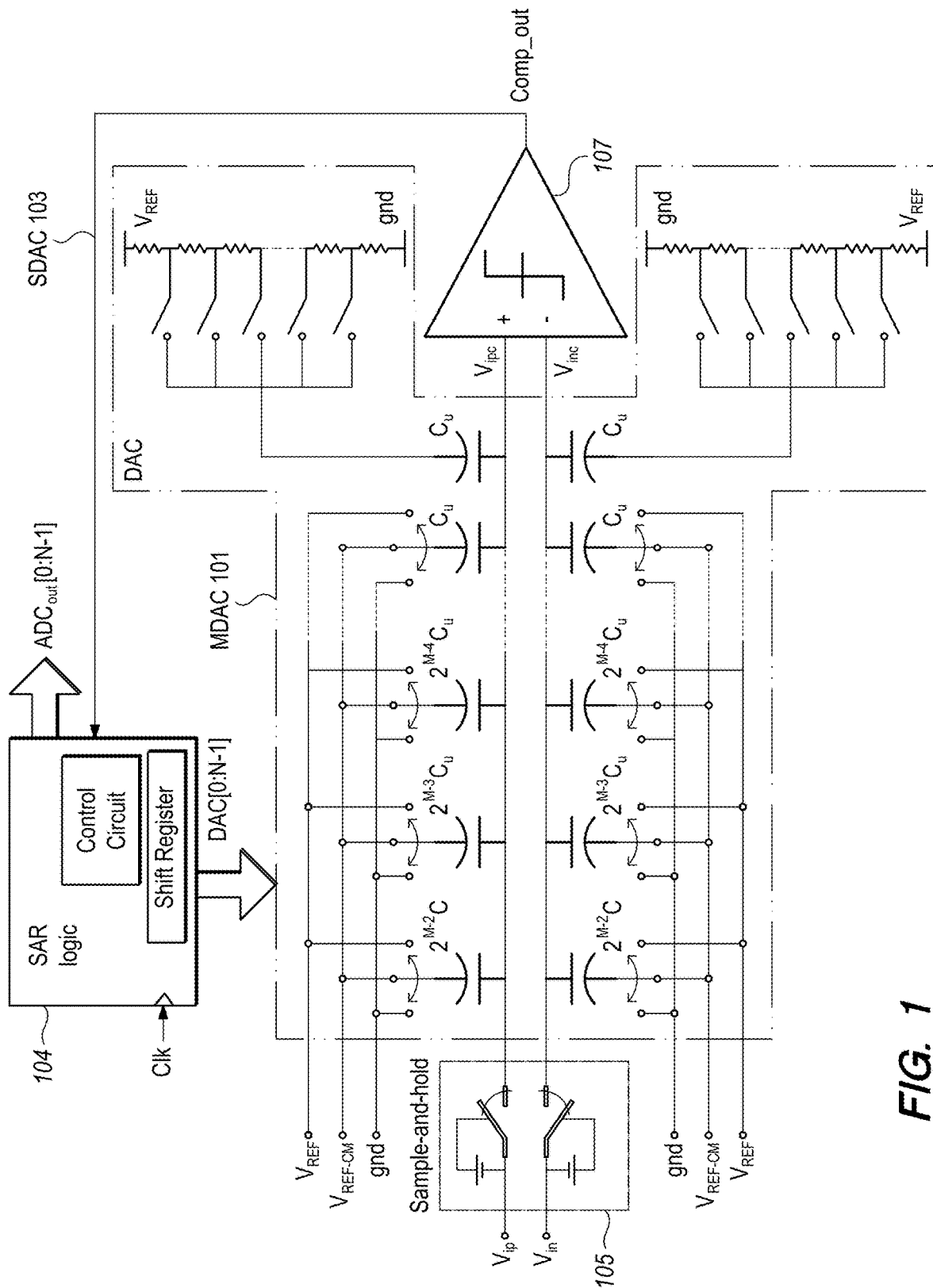
FIG. 1 is a block diagram of a SAR ADC.

A 13-bit differential SAR ADC, implemented in 0.18 µm technology, is shown in FIG. 1. The ADC DAC is realized by an M-bit capacitive main-DAC (MDAC) 101, and an N-bit resistive Sub-DAC (SDAC) 103, such that M+N is equal to 13-bits. M is equal to 9 and N is equal to 4 in this design. The capacitive MDAC is binary weighted with the smallest capacitance element equal to $C_u$. The back-plate side of the capacitors can be connected to $V_{REF}$, $V_{REF}/2$, or ground (gnd). The resistive SDAC is a thermometer based DAC.

The input differential signal, $V_{id}$ ($V_{id}=V_{ip}-V_{in}$) is sampled, by the bootstrapped switches, $S_1$, of a sample-and-hold unit 105 on the MDAC capacitors. During sampling, all the capacitors back-plates are connected to $V_{REF}/2$. The sampled input signal is held on the MDAC capacitance, thus the differential voltage, $V_{idc}$($V_{idc}=V_{ipc}-V_{inc}$), at the input of the comparator 107 is equal, initially, to a sampled version of the input differential signal $V_{id}$, and in the first cycle of the bit-cycling process, the comparator compares the sampled $V_{ip}$ to $V_{in}$, or in other words it compares $V_{id}$ to zero, which is the mid-scale value for the differential signal. Based on the comparator output, the SAR Logic 104 determines whether $V_{id}$ is positive or negative, sets the digital output MSB accordingly, and sends a control word to the DAC to generate the voltage value to be used in the second comparison cycle of the bit-cycling process. Note that since the signal is sampled on the top plate of the DAC capacitance, the MSB is resolved with no MDAC capacitor switching, and therefore the DAC capacitor array total capacitance (one-side) is $2^{M-1} C_u$, which is half that of the conventional approach [7].

More specifically, if the comparator indicates that $V_{id}$ is positive ($V_{ip}>V_{in}$), the comparator outputs logic "1", and the control word to the DAC connects the back-plate of the $C_{MSB}$ ($=2^{M-2}C_u$), of the p-side to gnd, and the corresponding capacitor on the n-side to $V_{REF}$. Hence, a voltage step of $-V_{REF}/2$ and $V_{REF}/2$ are applied to the p-side and the n-side capacitor dividers formed by each DAC side, thus, ideally (ignoring the comparator parasitic capacitance) $V_{idc}$ becomes $$V_{idc} = V_{id} + \frac{-V_{REF}}{2}\left[\frac{2^{M-2}C_u}{C_u + \sum_{k=0}^{M-2} 2^k C_u}\right] - \frac{+V_{REF}}{2}\left[\frac{2^{M-2}C_u}{C_u + \sum_{k=0}^{M-2} 2^k C_u}\right] \quad (1)$$

where $$C_u + \sum_{k=0}^{M-2} 2^k C_u = 2^{M-1} C_u$$

Therefore, $$V_{idc} = V_{id} - \frac{V_{REF}}{2} \quad (2)$$

That is the comparator compares $V_{id}$ to $V_{REF}/2$, and the output of the comparator indicates whether $V_{id}$ is greater than or smaller than $V_{REF}/2$. Otherwise, if $V_{id}$ is negative, the p-side and n-side reverse their switching, comparing $V_{id}$ to $-V_{REF}/2$. The SAR logic sets the bit following the MSB of the digital output accordingly, and sends a control word to the DAC, switching the capacitors following the MSB capacitors to generate a new DAC voltage, and comparing $V_{id}$ to a value greater or smaller than $V_{REF}/2$, by $V_{REF}/4$, in the third cycle of bit-cycling, hence $$V_{idc} = V_{id} \pm \frac{V_{REF}}{2} \pm \frac{V_{REF}}{4} \quad (3)$$

Figure 2A:
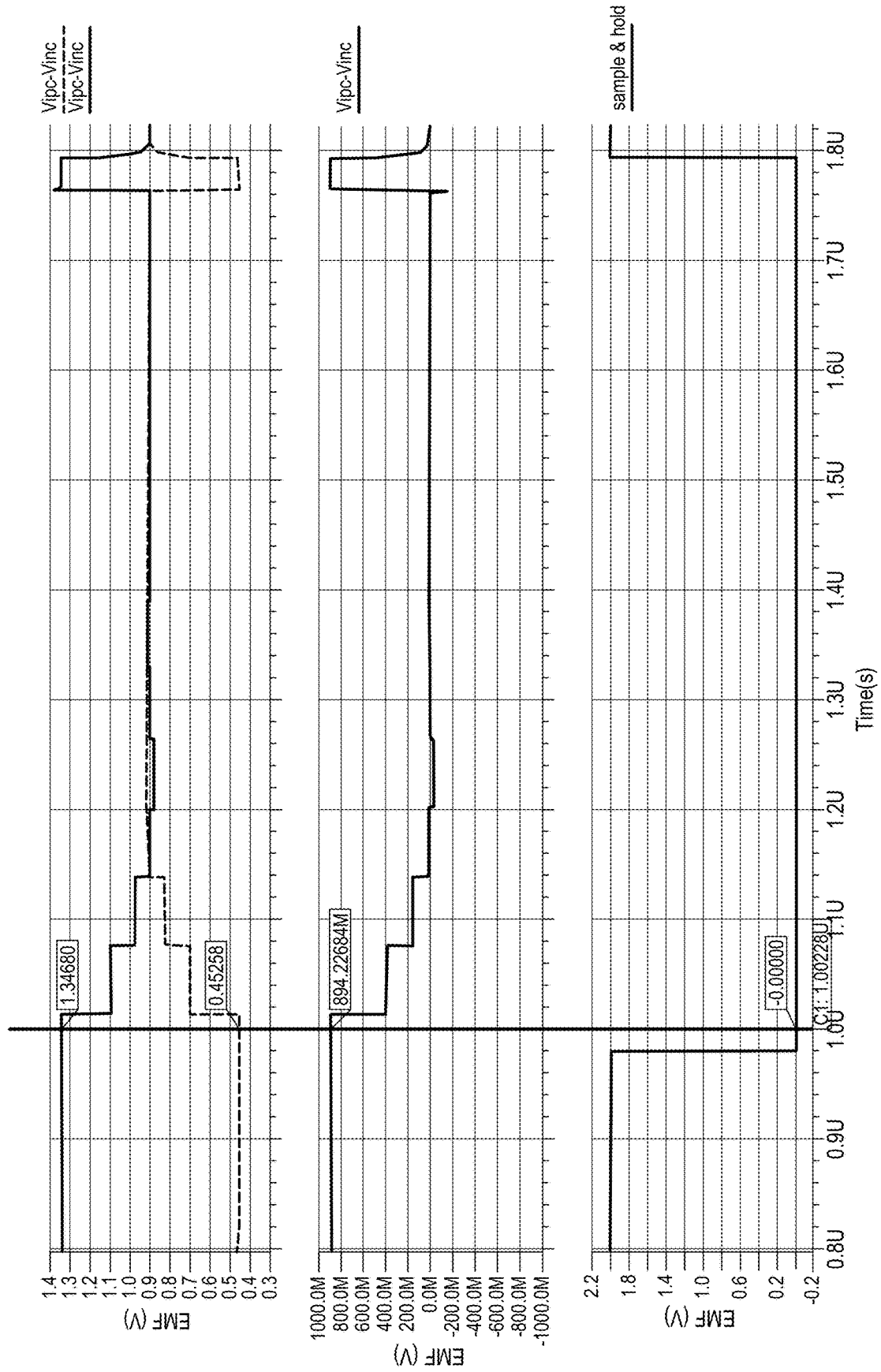
FIG. 2A is a plot of the simulation results showing the waveforms of the input signals to the comparator, $V_{ipc}$, and $V_{inc}$, during sample-and-hold and the subsequent bit-cycling, the corresponding differential signal ($V_{ipc}-V_{inc}$), for a large input signal close to full-scale, in addition to the sample-and-hold signal.
Figure 2B:
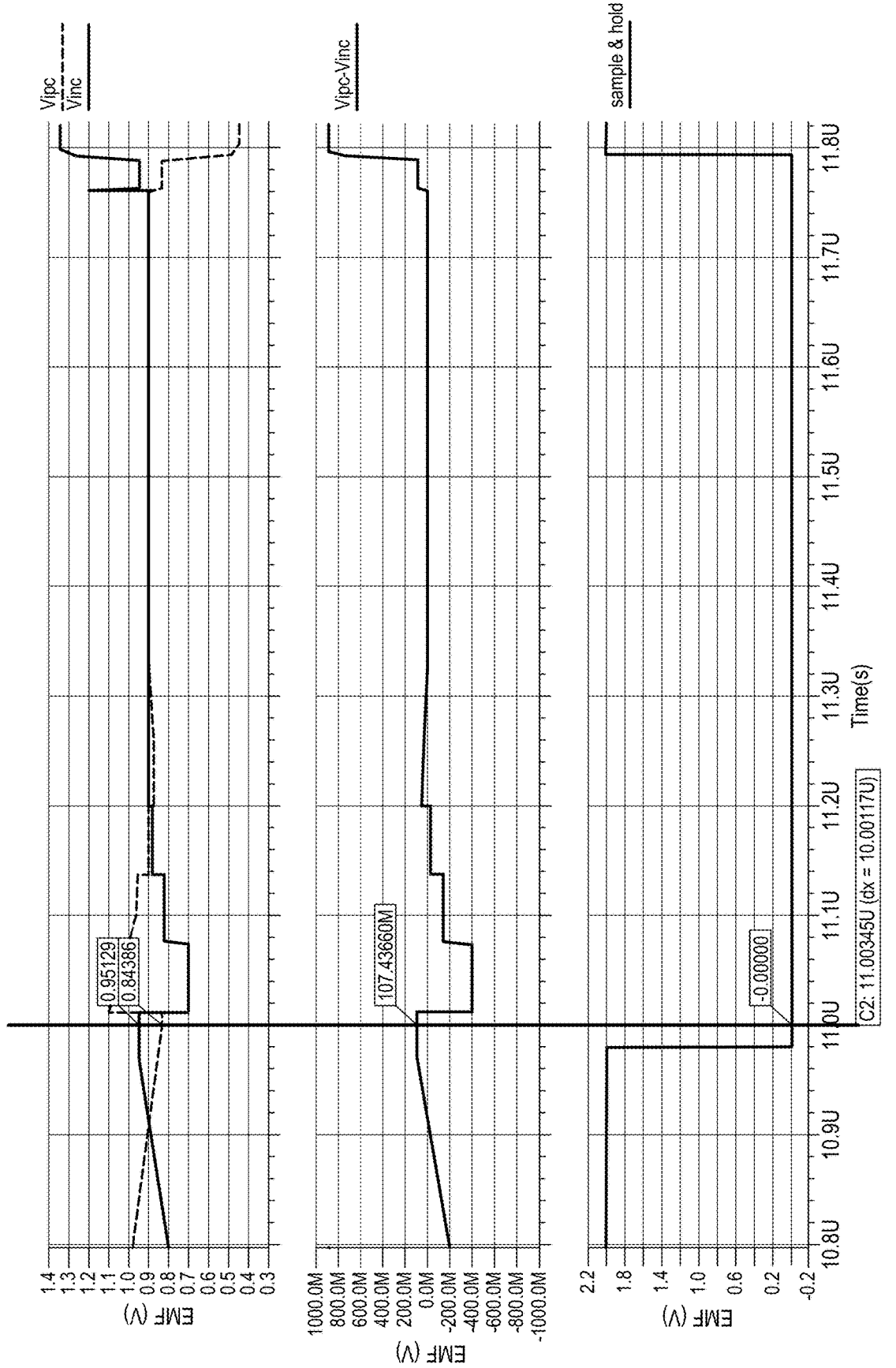
FIG. 2B is a plot of the simulation results showing the waveforms of the input signals to the comparator, $V_{ipc}$, and $V_{inc}$, during sample-and-hold and the subsequent bit-cycling, the corresponding differential signal ($V_{ipc}-V_{inc}$), for a small input signal, in addition to the sample-and-hold signal.

This process of conversion (bit-cycling) continues, switching the MDAC capacitors, in order, until M bits are resolved, and then the SDAC resolves the remaining N-bits. The resulting waveforms of $V_{ipc}$ and $V_{inc}$, during sampling and bit-cycling, are shown in FIG. 2A and FIG. 2B. It is important to note that voltage levels of $V_{ipc}$ and $V_{inc}$ converge to the value of the input signal common-mode voltage, and that the large voltage steps are only experienced in the first few steps of bit-cycling. That is to say that, in the later bit-cycling cycles, the input signals to the comparator get close to the common-mode value of the of the input signal, and the comparator input capacitance is relatively constant. Thus, the largest capacitance variation is experienced in the first bit-cycling step.

Figure 3:
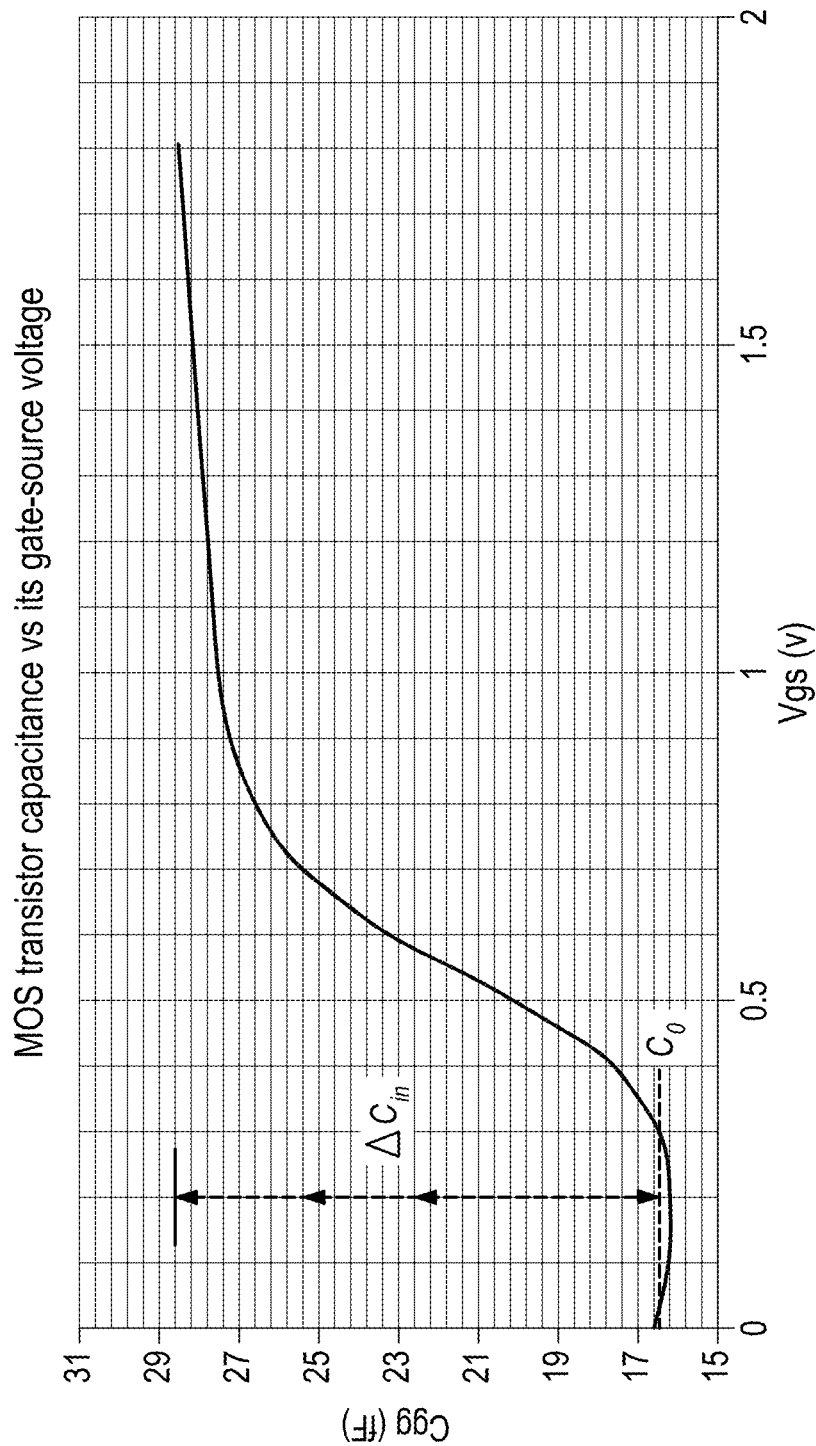
FIG. 3 is a plot of the comparator input transistor parasitic capacitance as a function in the input voltage.

Accordingly, the comparator is basically comparing the sampled input $V_{id}$ to the DAC output voltage, $V_{DAC}$, and (3) can be re-formulated as $$V_{idc} = V_{id} - V_{DAC} \quad (4)$$

where $V_{DAC}$ is given by $$V_{DAC} = V_{REF}\left(\pm \frac{C_{MSB}}{C_T} \pm \frac{C_{MSB-1}}{C_T} \pm \frac{C_{MSB-2}}{C_T} \pm \ldots\right) \quad (5)$$

where $C_T$ is equal to $2^{M-1}C_u$ and represents the total capacitance of one side of the MDAC. Eq. (1)-(5) represent the ideal operation. However, since the comparator has a parasitic input capacitance, this capacitance contributes to the capacitor divider formed by the MDAC. A plot of the comparator input-transistor capacitance, as a function of the input voltage to the transistor, is shown in FIG. 3. The transistor has an almost fixed capacitance value ($C_0$) when it is OFF (input voltage to the transistor is low and less than the transistor threshold voltage), and an increasing capacitance value with the input voltage, when it turns on. Therefore, the capacitance can be assumed to be composed of a fixed part $C_0$, and a variable input-dependent part $\Delta C_{in}$.

Figure 4A:
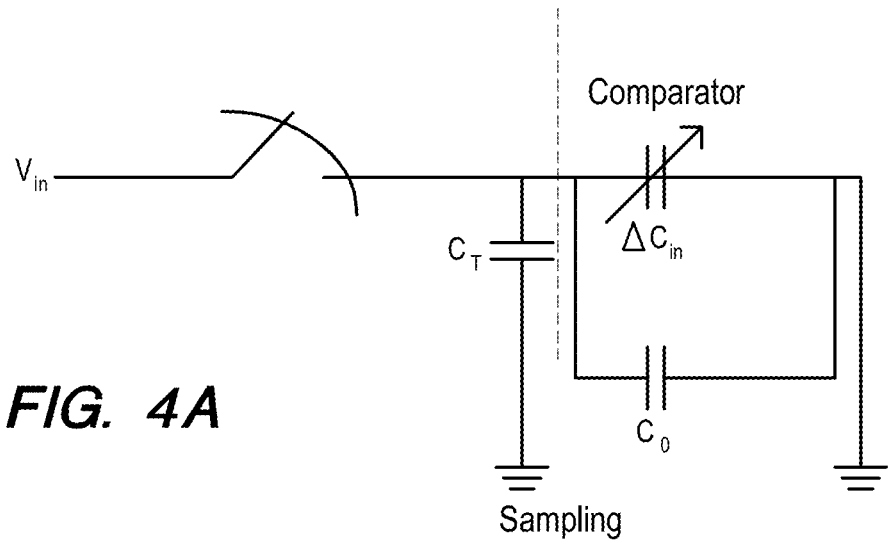
FIG. 4A is a diagram of a single ended version of the MDAC, in the sampling phase of operation.
Figure 4B:
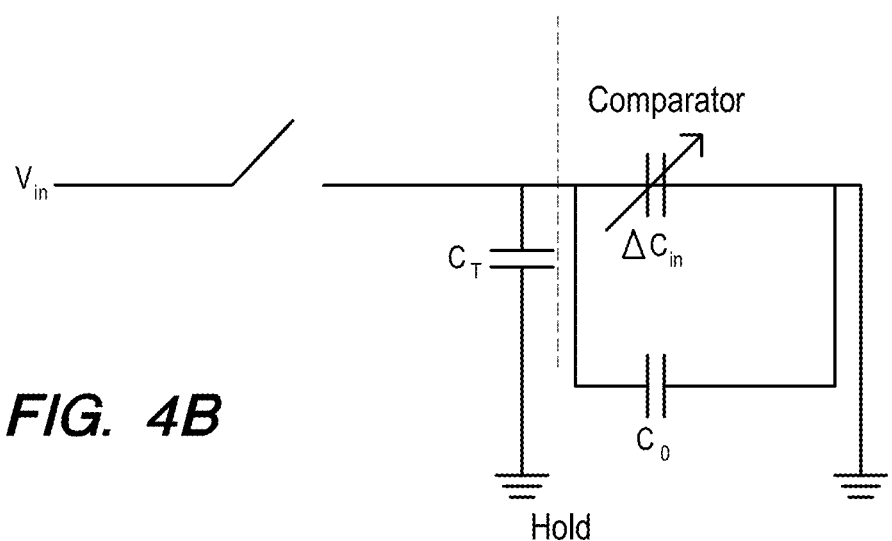
FIG. 4B is a diagram of a single ended version of the MDAC, in the hold phase of operation.
Figure 4C:
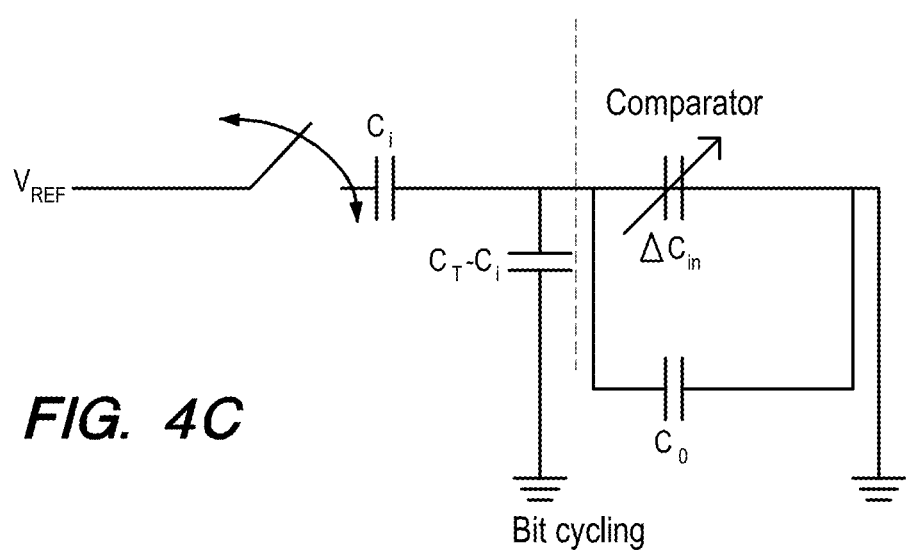
FIG. 4C is a diagram of a single ended version of the MDAC, in the bit-cycling phase of operation.

The comparator capacitance is considered in FIG. 4A-FIG. 4C, where different phases of operation are illustrated, and a single-ended version of the MDAC is considered for clarity. In FIG. 4C, $C_i$ can be any of the MDAC capacitors ($C_{MSB}, C_{MSB-1}, \ldots$, etc.). The switching operation of each side of the MDAC can be described by referring to FIG. 4A-FIG. 4C. In FIG. 4A, illustrating a sampling phase of operation, a sampling switch is closed, and the capacitance of the comparator may be represented as shown. In FIG. 4B, illustrating a hold phase of operation, the sampling switch is open, and the capacitance of the comparator may be represented as shown. In FIG. 4C, illustrating bit-cycling, a switch (different than the sampling switch) associated with a capacitor $C_i$ may be open or closed, and the capacitance of the comparator may be represented as shown.

Considering the comparator non-linear capacitance, the voltage added or subtracted to the sampled input differential signal, due to capacitor switching is $$V'_{DAC} = V_{REF}\left(\pm \frac{C_{MSB}}{C_T + C_0 + \Delta C_{in}} \pm \frac{C_{MSB-1}}{C_T + C_0 + \Delta C_{in}} \pm \frac{C_{MSB-2}}{C_T + C_0 + \Delta C_{in}} + \ldots\right) \quad (6)$$

$$= V_{REF}\frac{C_T}{C_T + C_0 + \Delta C_{in}}\left(\pm \frac{C_{MSB}}{C_T} \pm \frac{C_{MSB-1}}{C_T} \pm \frac{C_{MSB-2}}{C_T} \pm \ldots\right)$$

-continued $$= V_{DAC} \frac{C_T}{C_T + C_0 + \Delta C_{in}}$$

That is, the V'$_{DAC}$ is a scaled version of the ideal case V$_{DAC}$. A more accurate description is that V'$_{DAC}$ is a distorted version of V$_{DAC}$, since the term $C_T/(C_T+C_0+\Delta C_{in})$ is not of a constant value, and the value of $\Delta C_{in}$ is input-signal dependent.

Figure 5:
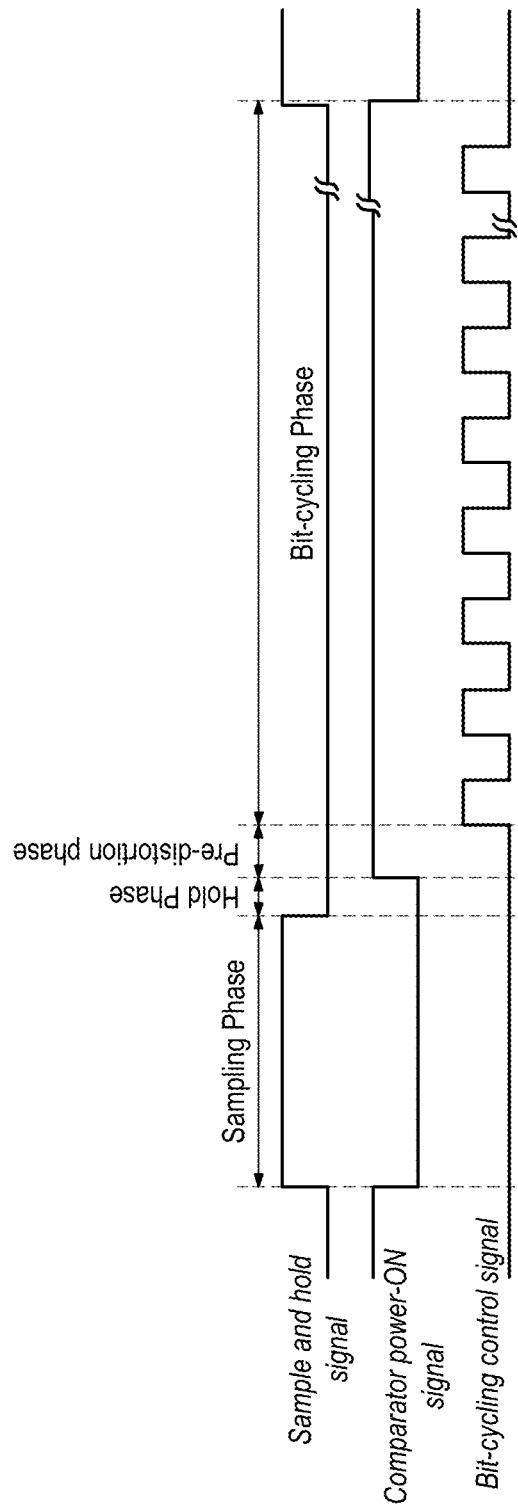
FIG. 5 is a timing diagram for the proposed pre-distortion technique.

To compensate for the variation in the DAC steps values, an additional pre-distortion phase is introduced, after the sample-and-hold phase and before bit-cycling. For this pre-distortion to take effect, the comparator is powered-down during the sample-and-hold phase, and turned ON during the hold period only after occurrence of a sampling edge, before bit-cycling, as indicated in the timing diagram of FIG. 5. FIG. 6A-FIG. 6D illustrate the different phases of operation in this case. Compare FIG. 6A with FIG. 4A, FIG. 6B with FIG. 4B, and FIG. 6D with FIG. 4C. During the sampling and hold phases of FIG. 6A and FIG. 6B, the comparator is turned off, such that the input capacitance of the comparator is a constant $C_0$. During a subsequent proposed pre-distortion phase (FIG. 6C), the comparator is turned on, before the start of the bit-cycling phase. During bit cycling (FIG. 6D), the effective capacitance is the same as in the conventional case (FIG. 4C).

More particularly, referring to FIG. 6A-FIG. 6D, during sampling (comparator is OFF), the input-signal generates a charge on the MDAC capacitance, given by $$Q=(C_T+C_0)V_{in} \quad (7)$$

After the input signal is held on the capacitance $C_{T+}C_0$, that is in the pre-distortion phase, the comparator is powered-ON, and charge sharing results in $$Q=V'_{in}(C_T+C_0+\Delta C_{in}) \quad (8)$$

Therefore, the voltage held becomes $$V'_{in} = \frac{(C_T + C_0)V_{in}}{(C_T + C_0 + \Delta C_{in})} \quad (9)$$

Thus the held signal becomes a scaled (pre-distorted) value of the input signal in a similar manner to the DAC steps in (6). Therefore, $$\frac{V'_{in}}{V'_{DAC}} = \frac{V_{in}}{V_{DAC}} \frac{C_T}{C_T + C_0} \quad (10)$$

Hence, compared to the ideal case (V$_{in}$/V$_{DAC}$), the comparator causes only a gain error term ($C_T/(C_T+C_0)$), and the input-signal dependent non-linear term that has $\Delta C_{in}$ is cancelled.

According to (7)-(10), the described technique would result in perfect elimination of the comparator non-linear effect. However, in practice, the comparator capacitance $\Delta C_{in}$ changes during, bit-cycling. Nevertheless, since the largest change in the capacitance is in the first step of bit-cycling, compensating the comparator capacitance by its value at the beginning of bit-cycling results in a considerable improvement. The exact behavior of the SAR ADC bit-cycling, together with the non-linear comparator input capacitance that depends on the comparator input voltage, cannot be captured by a closed-form formula, and can be only fully captured by simulation, as is the case in [4]. The analysis presented is more intended to show that the improvement is achieved by pre-distorting V$_{in}$, in the same direction of the DAC step error and by a factor that is a function of $\Delta C_{in}$, resulting in partial compensation.

Figure 7A:
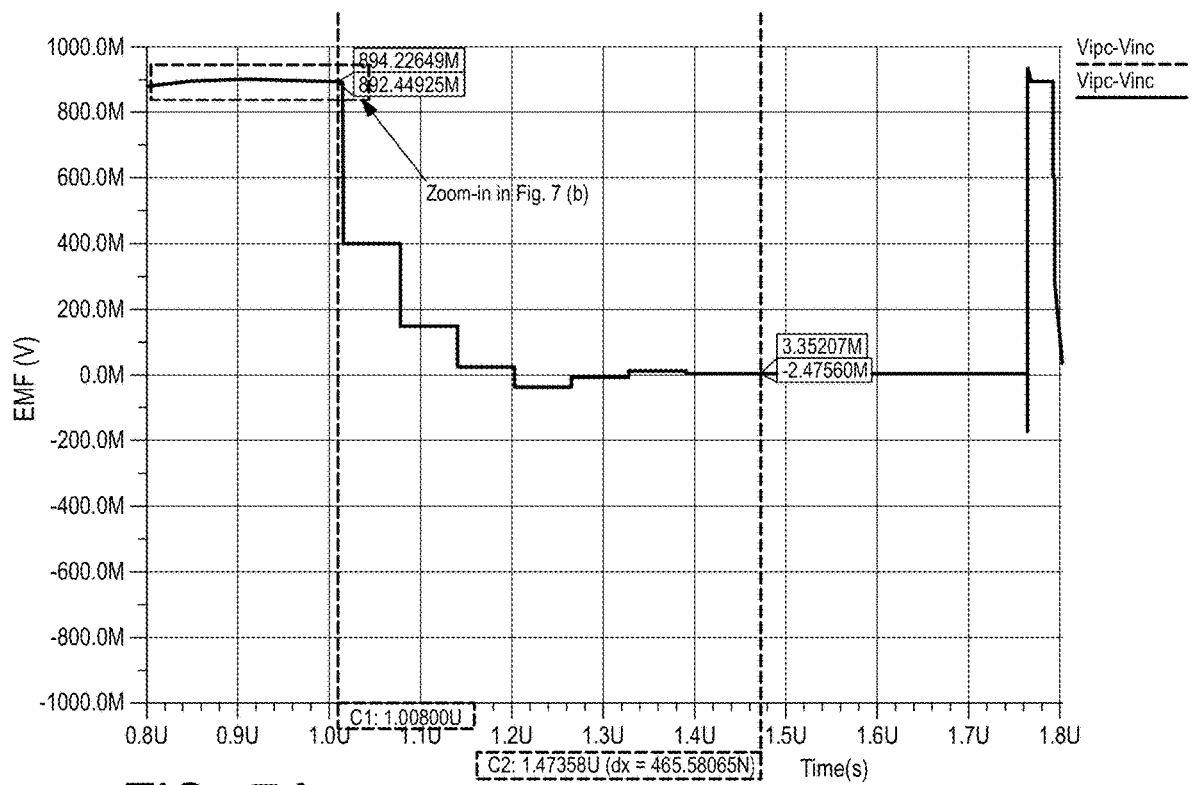
FIG. 7A is a plot of the simulation results of the SAR ADC showing the differential input signal to the comparator ($V_{ipc}-V_{inc}$), for a conventional SAR ADC (dotted line), and the described pre-distortion technique (solid line), for a large input signal showing the complete conversion cycle.
Figure 7B:
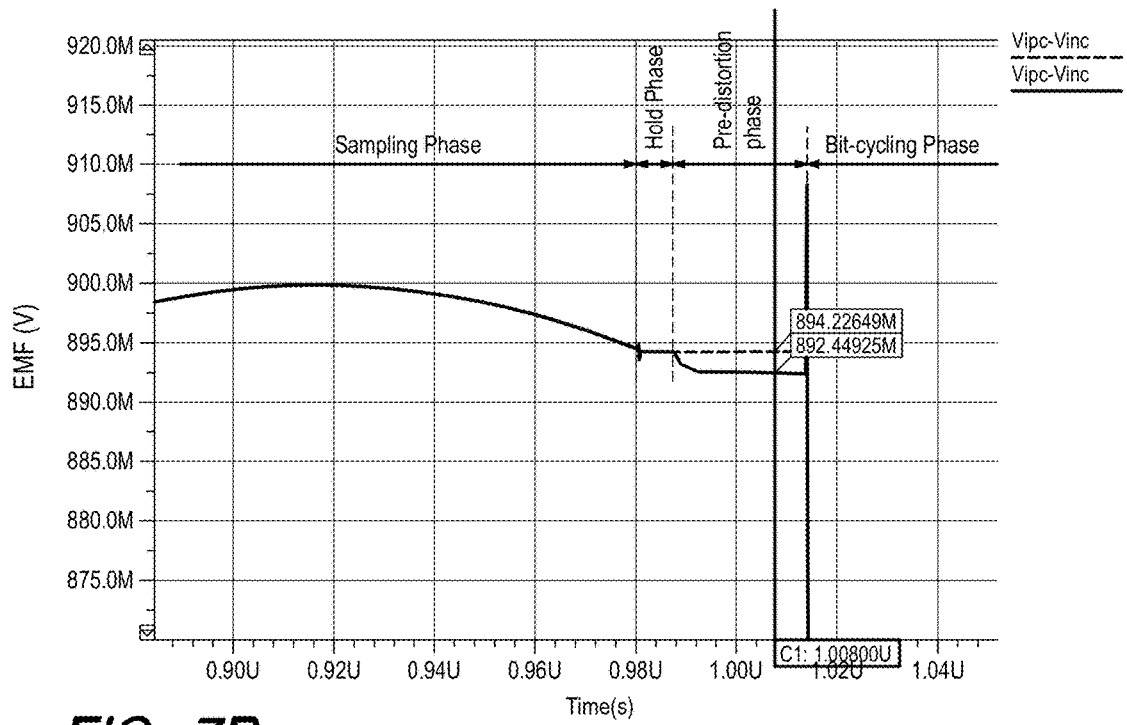
FIG. 7B is a plot showing a zoom-in for a portion of the signal of FIG. 7A.
Figure 8A:
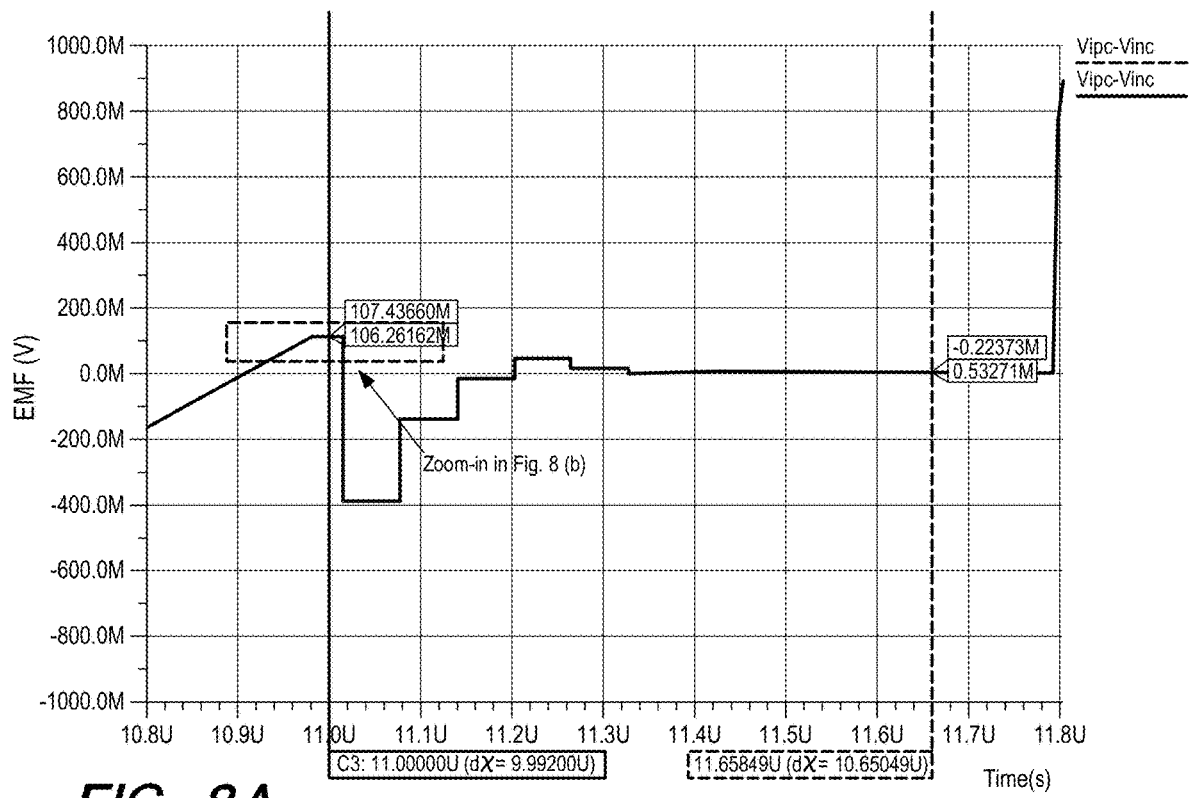
FIG. 8A is a plot of the simulation results of the SAR ADC showing the differential input signal to the comparator ($V_{ipc}-V_{inc}$), for a conventional SAR ADC (dotted line), and the described pre-distortion technique (solid line), for a small input signal showing the complete conversion cycle.
Figure 8B:
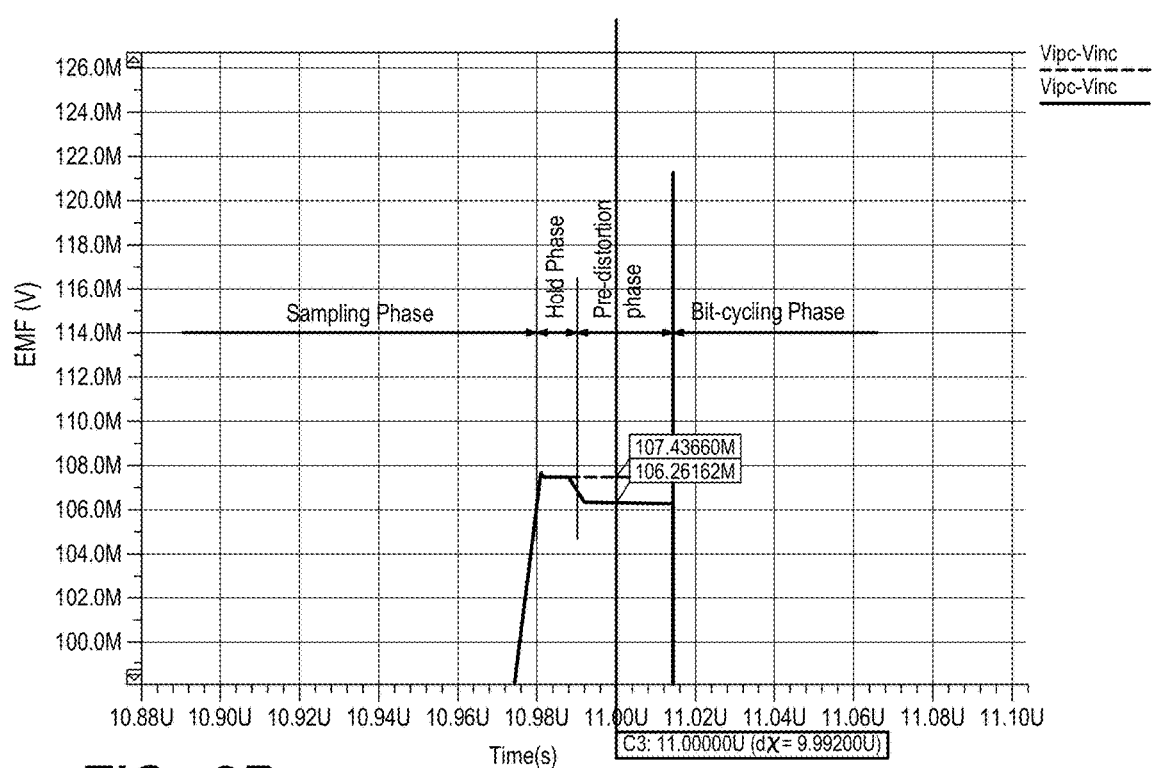
FIG. 8B is a plot showing a zoom-in for a portion of the signal of FIG. 8A.

The simulation results of the SAR ADC with and without the described pre-distortion technique are shown in FIG. 7A and FIG. 7B and in FIG. 8A and FIG. 8B, for a large-input signal and a small-input signal respectively. The ADC V$_{REF}$=1V, and the ADC least-significant-bit (LSB)=0.244 mV. For the large input signal of value 894.226 mV (FIG. 7A), the pre-distortion phase pre-distorts the input signal by a step of 1.777 mV, which represents 7.28 LSB, and hence the held-signal is decreased to 892.449 mV. While, for the small input-signal, of 107.436 mV (FIG. 8A), which is about 8 times smaller than the large-signal, the step is 1.175 mV (4.8LSB). The pre-distortion step for the large input signal is about 0.2% of its value, whereas the pre-distortion step for the small input-signal is around 1.1% of the its value, which is greater percent than that for the large input-signal. This distorted step mechanism agrees with the simple expressions derived earlier, since the comparator capacitance ($\Delta C_{in}$) seen by the differential signal applied to the comparator is greater for the case of the small input-signal. The pre-distortion steps compensate, considerably, the distorted DAC steps, due to the comparator input-capacitance non-linearity.

Figure 9:
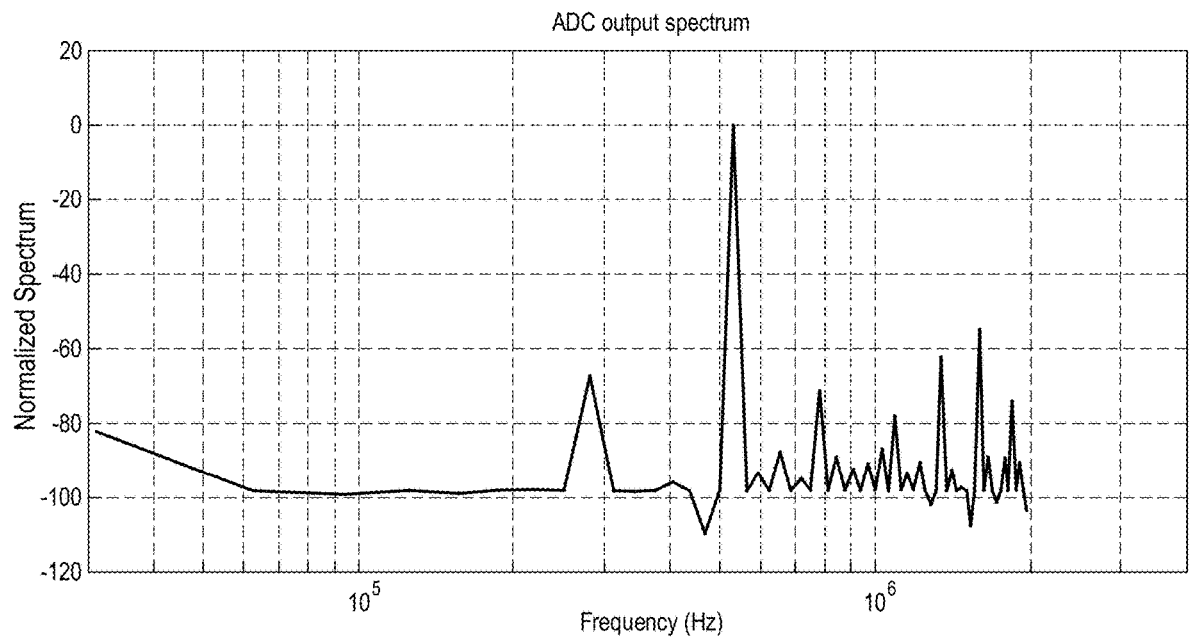
FIG. 9 is a plot of a 128 point FFT of the ADC output at a sampling frequency of 4 MHz, and an input-signal frequency of 531.25 KHz, without the described technique.
Figure 10:
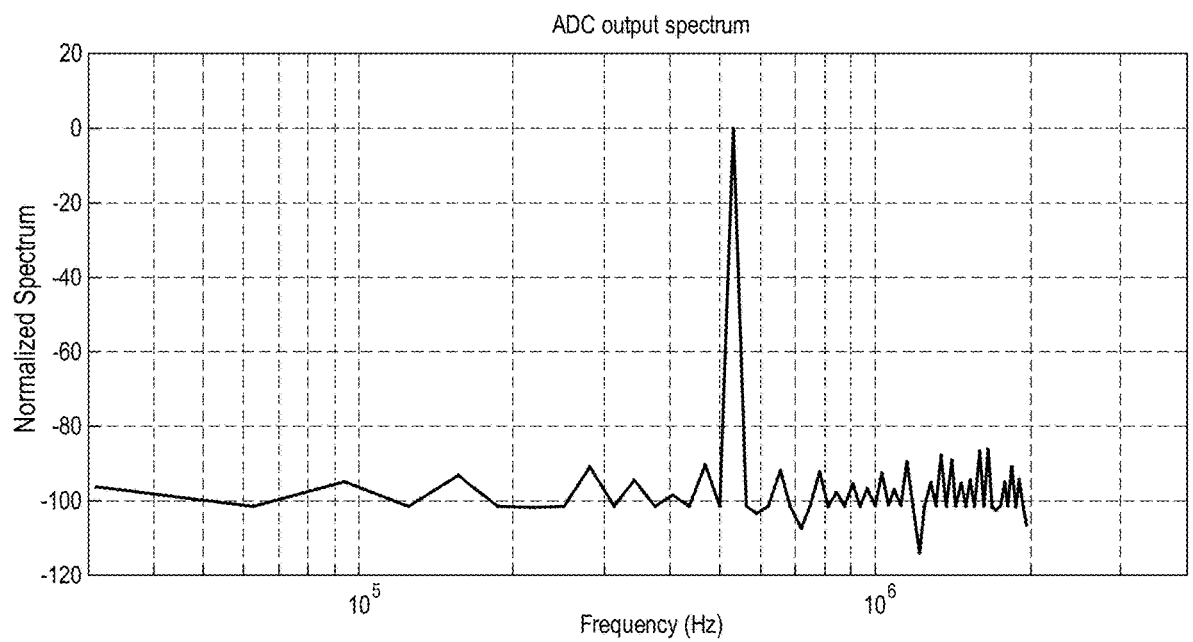
FIG. 10 is a plot of a 128 point FFT of the ADC output at a sampling frequency of 4 MHz, and an input-signal frequency of 531.25 KHz, with the described technique.

128-point FFT plots of the SAR ADC output without and with the proposed technique are shown in FIG. 9 and FIG. 10, respectively, for an input-signal frequency of 531.25 KHz, and a sampling frequency of 4 MHz. FIG. 9 shows that the ADC output experiences a considerable non-linearity with a third harmonic at −54.6 dB, and few other folded-back higher order harmonics. As stated earlier, the degradation in performance, due to the comparator non-linear capacitance of the comparator depends on the ratio of the comparator capacitance to the linear capacitance of the MDAC. The signal-to-noise-plus-distortion (SNDR) achieved without applying the proposed technique is 52.7 dB (FIG. 9). FIG. 10 shows a significant reduction in signal harmonics. An SNDR of 76 dB is achieved, when applying the pre-distortion technique (FIG. 10), which corresponds to more than 3.5 bits of improvement in performance.

It will be appreciated by those skilled in the art that the present invention may be embodied in other specific forms without departing from the spirit or essential character thereof. The disclosed embodiments are therefore intended in all respects to be illustrative and not restrictive. The scope of the invention is indicated by the appended claims rather than the foregoing description, and all changes that come within the scope and range of equivalents thereof are intended to be embraced therein.

What is claimed is:

1. A method of converting an analog signal to a digital signal using successive approximation, using circuitry comprising a sampling unit, a capacitor array, a sampling capacitor, a comparator, a successive approximation register and control logic, wherein, the method comprising:
   during a sampling phase that ends at a sampling edge, coupling the sampling capacitor to an input voltage and powering off the comparator;
   during a hold phase that begins at the sampling edge, de-coupling the sampling capacitor from the input voltage with the comparator powered off;
   during a pre-distortion phase subsequent to the hold phase and before a bit cycling phase, powering on the comparator with the sampling capacitor de-coupled from the input voltage, such that distortion caused by input capacitance variations of the comparator is reduced; and during the bit-cycling phase subsequent to the pre-distortion phase, coupling the sampling capacitor to a reference voltage with the comparator powered on.

2. An analog to digital converter for converting an analog signal to a digital signal using successive approximation, wherein the analog to digital converter is configured to provide a pre-distortion phase, following a sampling phase and prior to a bit-cycling phase, comprising:

a sampling unit for sampling an analog input signal to produce a sampled signal;

a capacitor array coupled to the sampling unit for producing an approximation signal;

a comparator coupled to the capacitor array for comparing the approximation signal to the sampled signal; and a successive approximation register and control logic coupled to the comparator, the control logic:

during a sampling phase, powering off the comparator and coupling the sampling capacitor to an input voltage;

during a hold phase that begins subsequent to the sampling phase, de-coupling the sampling capacitor from the input voltage with the comparator powered off;

during a pre-distortion phase subsequent to the hold phase and before a bit cycling phase, powering on the comparator with the sampling capacitor de-coupled from the input voltage, such that distortion caused by input capacitance variations of the comparator is reduced; and during the bit-cycling phase subsequent to the pre-distortion phase, coupling the sampling capacitor to a reference voltage with the comparator powered on.

3. A method of converting an analog signal to a digital signal using successive approximation, the method comprising:

after a sampling phase and a hold phase, and before beginning a bit cycling phase, performing pre-distortion of a held signal by performing charge sharing between a sampling capacitor and a parasitic capacitance of a comparator, the held signal sampled during the sampling phase and held during the hold phase;

whereby distortion caused by input capacitance variations of the comparator is reduced in the bit cycling phase in accordance with the pre-distortion.

4. An analog to digital converter for converting an analog signal to a digital signal using successive approximation, comprising:

a sampling unit for sampling an analog input signal to produce a sampled signal;

a capacitor array coupled to the sampling unit for producing an approximation signal;

a comparator coupled to the capacitor array for comparing the approximation signal to the sampled signal; and a successive approximation register and control logic coupled to the comparator, the control logic:

after a sampling phase and a hold phase, and before beginning a bit cycling phase, performing pre-distortion of a held signal by performing charge sharing between a sampling capacitor and a parasitic capacitance of the comparator, the held signal sampled during the sampling phase and held during the hold phase;

whereby distortion caused by input capacitance variations of the comparator is reduced in the bit cycling phase in accordance with the pre-distortion.

5. A method of converting an analog signal to a digital signal using a main digital-to-analog converter (MDAC) comprising a sampling capacitor and a comparator, the method comprising:

sampling an analog input signal to produce a sampled signal on the sampling capacitor by coupling the sampling capacitor with an input signal while a comparator is powered off;

holding the sampled signal on the sampling capacitor subsequent to the sampling by de-coupling the sampling capacitor from an input signal while the comparator is powered off;

pre-distorting the sampled signal subsequent to the holding by powering on the comparator while holding the sampled signal on the sampling capacitor; and generating an approximation signal by bit-cycling and in accordance with the pre-distorting.

6. A successive approximation analog-to-digital converter comprising:

a main digital-to-analog converter (MDAC) comprising a sampling capacitor and a comparator; and control logic coupled with the MDAC to:

sample an analog input signal to produce a sampled signal on the sampling capacitor by coupling the sampling capacitor with an input signal while the comparator is powered off;

hold the sampled signal on the sampling capacitor subsequent to the sampling by de-coupling the sampling capacitor from an input signal while the comparator is powered off;

pre-distort the sampled signal subsequent to the holding by powering on the comparator while holding the sampled signal on the sampling capacitor; and generating an approximation signal by bit-cycling and in accordance with the pre-distorting.

* * * * *

UNITED STATES PATENT AND TRADEMARK OFFICE
CERTIFICATE OF CORRECTION

PATENT NO. : 10,917,105 B1
APPLICATION NO. : 16/115754
DATED : February 9, 2021
INVENTOR(S) : Ismail Ayman, George Botros and Elsayed Ayman It is certified that error appears in the above-identified patent and that said Letters Patent is hereby corrected as shown below:

On the Title Page

Item (12) change "Ayman et al." to read as -- Ismail et al. --

Item (72) should read:
-- (72) Inventors: Ayman Ismail, Cairo (EG); Botros George, Cairo (EG); Ayman Elsayed, Fountain Valley, CA (US) --

Signed and Sealed this
Thirty-first Day of May, 2022

Katherine Kelly Vidal
*Director of the United States Patent and Trademark Office*